US011152272B2

(12) United States Patent
Lan et al.

(10) Patent No.: US 11,152,272 B2
(45) Date of Patent: Oct. 19, 2021

(54) DIE-TO-WAFER HYBRID BONDING WITH FORMING GLASS

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 19 days.

(21) Appl. No.: 16/682,554

(22) Filed: Nov. 13, 2019

(65) Prior Publication Data

US 2021/0143071 A1 May 13, 2021

(51) Int. Cl.
*H01L 23/15* (2006.01)
*H01L 21/02* (2006.01)
*H01L 21/8238* (2006.01)

(52) U.S. Cl.
CPC ........ *H01L 23/15* (2013.01); *H01L 21/02013* (2013.01); *H01L 21/02422* (2013.01); *H01L 21/8238* (2013.01)

(58) Field of Classification Search
CPC ...................................................... H01L 23/15
See application file for complete search history.

(56) References Cited

U.S. PATENT DOCUMENTS

| 9,893,048 B2 | 2/2018 | Lan et al. |
| 2018/0012868 A1* | 1/2018 | Huang ................. H01L 25/0657 |
| 2018/0366437 A1* | 12/2018 | Chen ........................ H01L 24/19 |

* cited by examiner

*Primary Examiner* — William A Harriston
(74) *Attorney, Agent, or Firm* — Patterson & Sheridan, L.L.P.

(57) ABSTRACT

Certain aspects provide a three-dimensional integrated circuit (3DIC) and techniques for fabricating a 3DIC. For example, certain aspects provide a semiconductor device that generally includes one or more first integrated circuits (ICs), a first plurality of pads coupled to components of the one or more first ICs, one or more second ICs, forming glass (FG) material disposed adjacent to the one or more second ICs, and a second plurality of pads, wherein at least one of the second plurality of pads is coupled to components of the one or more second ICs, and wherein at least a portion of the first plurality of pads is bonded to at least a portion of the second plurality of pads.

20 Claims, 7 Drawing Sheets

DIE-TO-WAFER HYBRID BONDING WITH FORMING GLASS

FIELD OF THE DISCLOSURE

The present disclosure generally relates to semiconductor devices and, more particularly, to a three-dimensional integrated circuit (3DIC).

DESCRIPTION OF RELATED ART

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at high frequencies for supporting communication enhancements, such as carrier aggregation. These transistors may be implemented using compound semiconductor transistors, such as bipolar junction transistors (BJTs), heterojunction bipolar transistors (HBTs), high electron mobility transistors (HEMTs), pseudomorphic high electron mobility transistors (pHEMTs), and the like. Further design challenges for mobile RF transceivers include performance considerations for meeting future Fifth Generation (5G) transmission frequency specifications.

Complementary metal-oxide-semiconductor (CMOS) devices are fundamental components for integrated circuits to implement digital logic. A CMOS device typically includes a p-type metal-oxide-semiconductor (PMOS) transistor used to pull an output to logic high and an n-type metal-oxide-semiconductor (NMOS) transistor used to pull the output down to logic low, depending on an input signal provided to the gates of the PMOS and NMOS transistors. While CMOS devices may be used for digital signal processing, other integrated circuits (ICs) may be used to serve various functions such as signal amplification and filtering for wireless communication.

SUMMARY

Certain aspects of the present disclosure are directed to methods and apparatus for three-dimensional integrated circuits (3DICs).

Certain aspects provide a semiconductor device. The semiconductor device generally includes one or more first integrated circuits (ICs), a first plurality of pads coupled to components of the one or more first ICs, one or more second ICs, forming glass (FG) material disposed adjacent to the one or more second ICs, and a second plurality of pads, wherein at least one of the second plurality of pads is coupled to components of the one or more second ICs, and wherein at least a portion of the first plurality of pads is bonded to at least a portion of the second plurality of pads.

Certain aspects provide a method for fabricating a semiconductor device. The method generally includes forming one or more first ICs, forming a first plurality of pads coupled to components of the one or more first ICs, forming one or more second ICs, depositing FG material adjacent to the one or more second ICs, forming a second plurality of pads, at least one of the second plurality of pads being coupled to components of the one or more second ICs, and bonding at least a portion of the first plurality of pads to at least a portion of the second plurality of pads.

Other aspects, advantages, and features of the present disclosure will become apparent after review of the entire application, including the following sections: Brief Description of the Drawings, Detailed Description, and the Claims.

DETAILED DESCRIPTION

Figure 1:
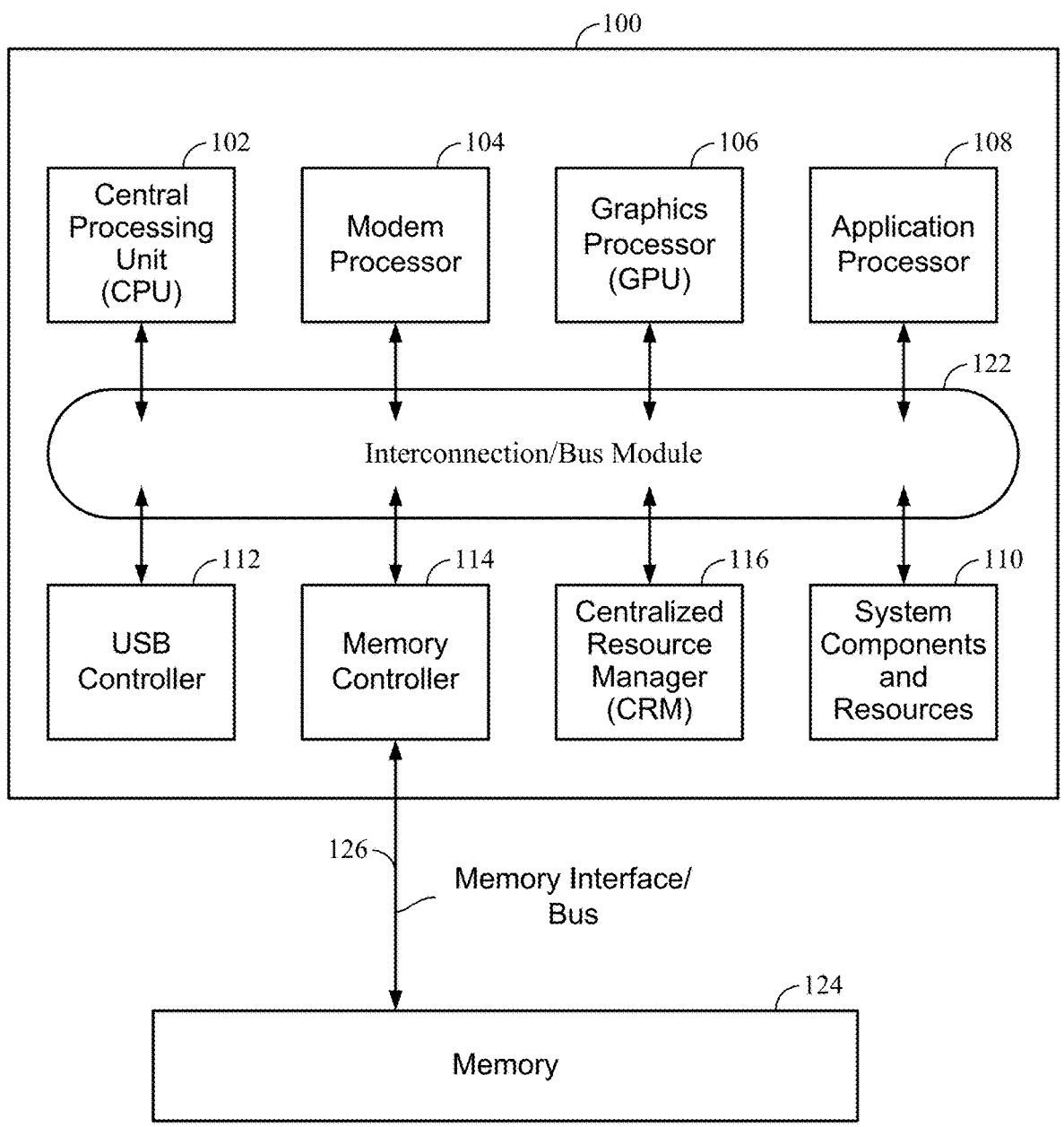
FIG. 1 illustrates an example implementation of a system-on-a-chip (SOC).

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In certain aspects, the memory 124 may be implemented using a ferroelectric semiconductor device, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Techniques for Die-to-Wafer Hybrid Bonding with Forming Glass

In the current fifth-generation (5G) and coming sixth-generation (6G) era, wireless communications though air interface over 10 gigabits per second (Gb/s) speed with low latency for various application is becoming more and more important. These applications may include autonomous driving, industry internet of things (IOT), remote medical operations/resources sharing, infotainment, gaming, education, and interactive-collaborations with artificial intelligence (AI), virtual reality (VR), augmented reality (AR), mixed reality (MR), and extended reality (XR) devices. Massive data transmission with live high-definition (HD) video and high fidelity voice over internet protocol (VoIP) audio content transmission for MR and XR involve both downlink and uplink speed much higher than 10 Gbps, which may only be realized with millimeter wave (mmWave) communications that offer wider bandwidth.

In order to realize this demand, advanced semiconductor technologies for sub-6 GHz radio frequency integrated circuit (RFIC) and mmWave/monolithic microwave IC (MIMIC) frontends have been developed. These semiconductor technologies may include gallium arsenide (GaAs) heterojunction bipolar transistor (HBT), high-electron-mobility transistor (HEMT), pseudomorphic high-electron-mobility transistor (pHEMT), indium phosphide (InP) double heterojunction bipolar transistor (DHBT), and gallium nitride (GaN) HEMT category III-V compound wide bandgap (WBG) semiconductors, along with advanced silicon complementary metal-oxide-semiconductor (CMOS) process technology nodes over bulk, silicon-on-insulator (SOI) and fully depleted (FD)-SOI process platforms that have been developed in the past decade for cutting-age modem, sensors, biometrics, and AI chips.

Certain aspects of the present disclosure are directed to a three-dimensional (3D) integrated circuit (3DIC) (also referred to herein as a "semiconductor device") implemented with hybrid copper (Cu)-to-copper (Cu) and oxide-to-oxide bonding (hereinafter referred to as "Cu-oxide" bonding) technology using a forming glass (FG) filler material. For implementation of a monolithic 3DIC, integration of silicon (Si)-based CMOS IC as a baseband logic controller with category III-V devices (e.g., GaAs pHEMT/metamorphic HEMT (mHEMT), GaAs HBT, InP DHBT, GaN-HEMT, etc.) for RF front-end key elements/blocks (e.g., power amplifier (PA), low noise amplifier (LNA), RF switch, and mixers) is important for achieving power, performance, area, and cost (PPAC) advantages for mmWave/MMIC deployment in applications of infrastructure/basestation, wireless fixed access point (WFA), customer premise equipment (CPE), and mobile user-equipment (UE) devices.

Certain aspects of the present disclosure are directed to a wafer-level die-to-wafer (D2W) stacking method based on hybrid bonding implemented with a forming glass filler material. In certain aspects, a reconstituted wafer may be used for bonding of dies (also referred to as "integrated circuits") in a batch process to the main-stream Si-CMOS integration, reducing the number of die pick-and-place (PnP) steps used in conventional D2W stacking processes and which allows for the simplification of the assembly bonding process flow of D2W stacking. In certain aspects, multiple dies with different functionalities and sizes may be fabricated with different process technologies. The dies may be transferred to a wafer and partitioned onto a Si-CMOS IC. Electrical connection to various components of the 3DIC may be implemented with through-silicon vias (TSVs), through-oxide vias (TOVs), and/or through-mold vias (TMVs) in a wafer-level and flip-chip bond (FCB) package.

Figure 2:
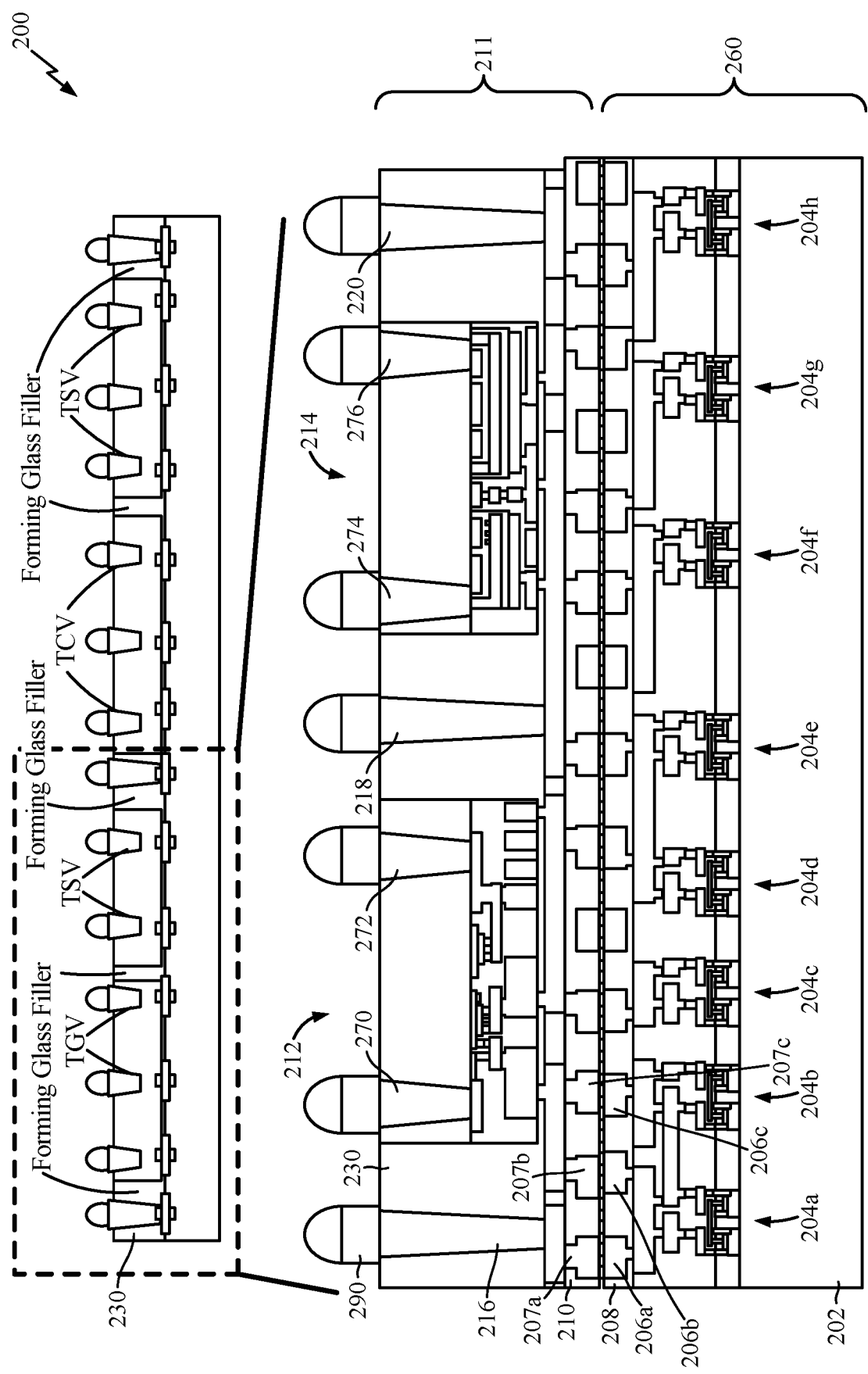
FIG. 2 illustrates a three-dimensional integrated circuit (3DIC) implemented with hybrid copper (Cu)-to-copper (Cu) and oxide-to-oxide bonding technology, in accordance with certain aspects of the present disclosure.

FIG. 2 illustrates a 3DIC 200 implemented with hybrid Cu-to-oxide bonding technology, in accordance with certain aspects of the present disclosure. As illustrated, the 3DIC 200 includes a CMOS substrate 202 on which CMOS transistors 204a, 204b, 204c, 204d, 204e, 204f, 204g, 204h may be formed. Each of the CMOS transistors is coupled to one or more copper (Cu) pads through various layers of a CMOS IC 260. For example, the Cu pads 206a, 206b, 206c may be coupled to CMOS transistor 204a, 204b, as illustrated in FIG. 2. The Cu pads may be formed using a copper damascene process.

Cu pads may be embedded in oxide that has gone through a chemical-mechanical polishing (CMP) process. For example, oxide 208 may be formed between the Cu pads of the CMOS IC 260, followed by a CMP process of the oxide. Hybrid Cu-oxide bonding may be used to bond Cu pads (e.g., Cu pads 206a, 206b, 206c) of the CMOS IC 260 to Cu pads (e.g., Cu pads 207a, 207b, 207c) of an IC package 211 (e.g., formed via a reconstituted wafer).

The IC package 211 may include various dies having different functions such as GaAs device die 212 and a micro-electro-mechanical systems (MEMS) device die 214. Moreover, oxide 208 may be bonded to the oxide 210 of the IC package 211 during the hybrid bonding process. The oxide 210 may be formed between the Cu pads (e.g., Cu pads 207b, 207c) coupled to dies (e.g., GaAs device die 212 and MEMS device die 214) of the IC package 211 using a chemical vapor deposition (CVD) oxide deposition process. Vias 216, 218, 220 may be formed for electrical connectivity to the CMOS transistors. For example, via 216 may be coupled between the contact 290 and the Cu pad 207a. One or more other vias may be formed for electrical connectivity to components of the GaAs device die 212 and the MEMS device die 214. For example, vias 270, 272 may be through-GaAs vias (TGVs) coupled to components (e.g., HBT, HEMT, diode) of the GaAs device die 212, and vias 274, 276 may be through-silicon vias (TSVs) coupled to components (e.g., switch and varactor) of the MEMS device die 214.

As illustrated, forming glass (FG) material 230 (also referred to as "FG filler") is formed around the GaAs device die 212 and the MEMS device die 214. In other words, the FG material 320 is used as a die filler and functions as a molding compound that can withstand the high temperatures associated with the CVD oxide deposition process. Moreover, the FG material is able to withstand the high temperatures associated with the copper damascene process used to form the Cu pads, as described herein. Thus, the vias 216, 218, 220 may be through-mold vias (TMVs).

Figure 3:
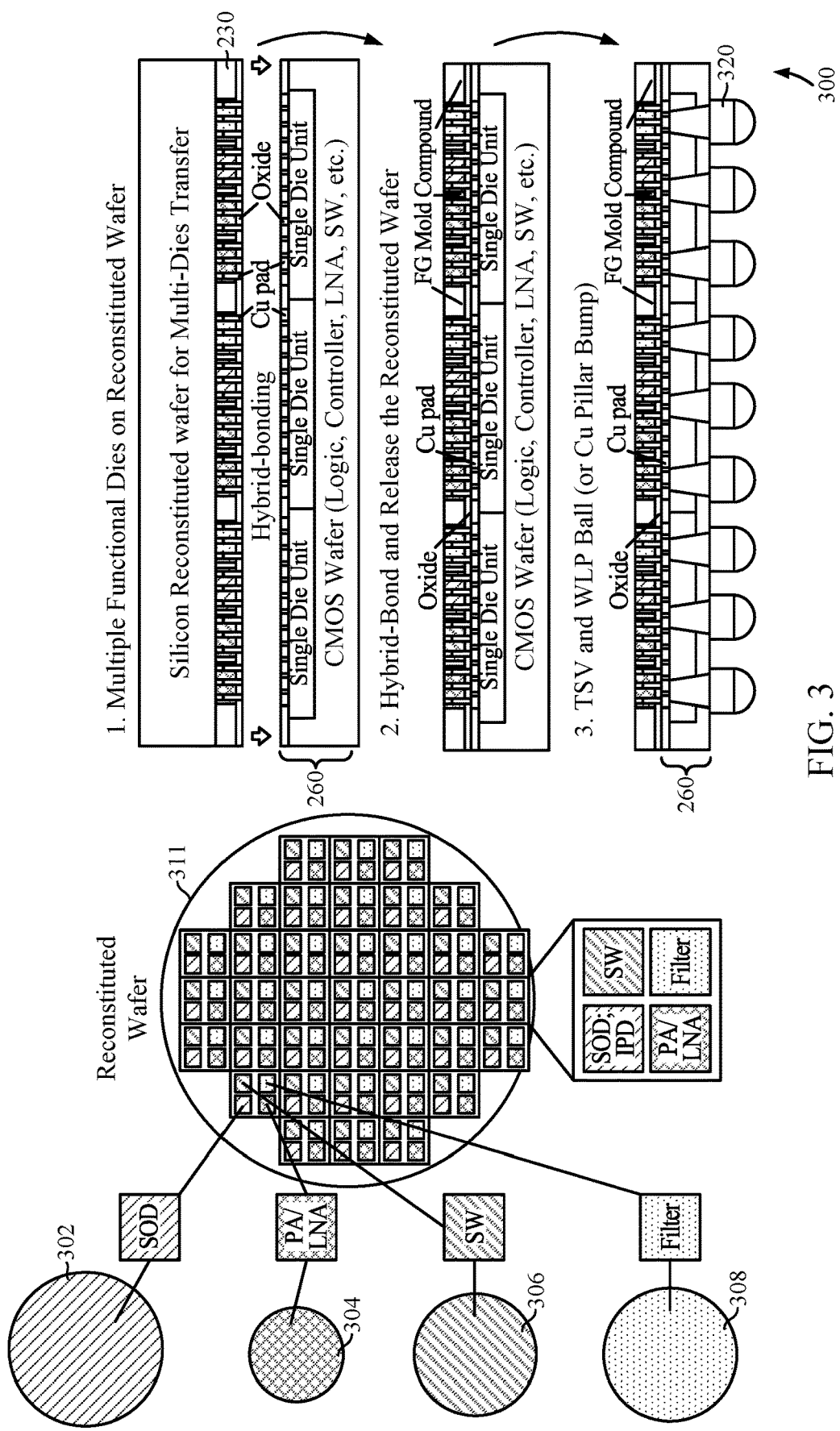
FIG. 3 illustrates techniques for fabricating a 3DIC using a reconstituted wafer and a complementary metal-oxide-semiconductor (CMOS) integrated circuit (IC), in accordance with certain aspects of the present disclosure.

FIG. 3 illustrates techniques for fabricating a 3DIC 300 using a reconstituted wafer 311 and the CMOS IC 260, in accordance with certain aspects of the present disclosure. As illustrated, the reconstituted wafer 311 may include dies picked from wafers 302, 304, 306, 308. For example, silicon-on-diamond (SOD) devices may be picked from wafer 302, amplifiers (e.g., power amplifier (PA) and low-noise amplifier (LNA)) may be picked from wafer 304, MEMS switches (SWs) may be picked from wafer 306, and filter devices (e.g., broadband integrated passive device (IPD) filter, and/or narrowband acoustic filter) may be picked from wafer 308, as illustrated.

FG material 230 may be disposed between the dies of the reconstituted wafer 311 and can withstand the high temperature associated with the formation of the Cu pads, as described herein. Cu pads and oxide on the reconstituted wafer 311 may be hybrid bonded to the CMOS IC 260, as described herein. The substrate of the reconstituted wafer may then be released from the dies, followed by formation of vias and wafer-level package (WLP) balls or Cu pillar balls (e.g., Cu pillar ball 320 with a silver-tin (AgSn) cap).

Figure 4:
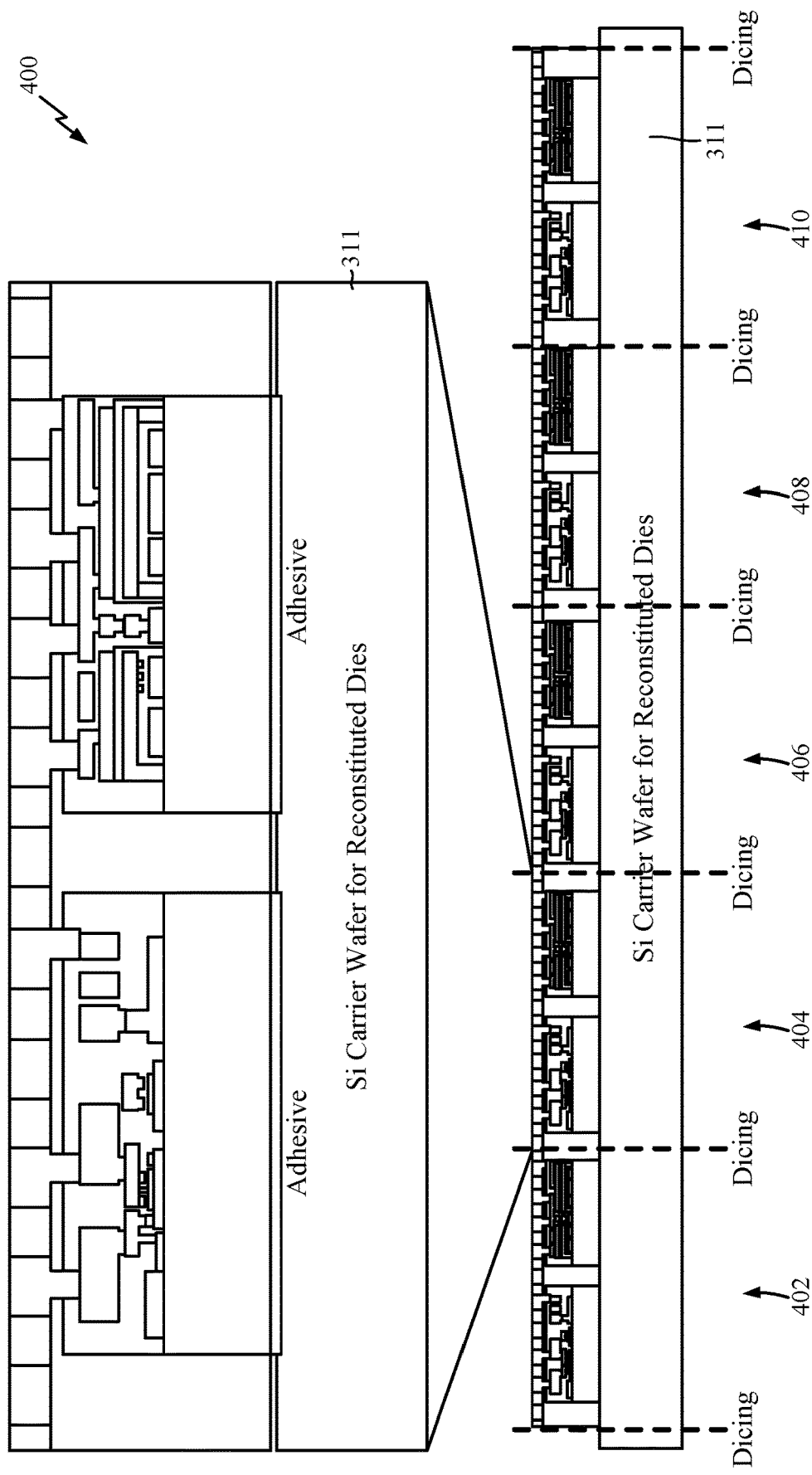
FIG. 4 illustrates a reconstituted wafer diced into multiple portions, each having one or more dies, in accordance with certain aspects of the present disclosure.

FIG. 4 illustrates a reconstituted wafer 311 diced into multiple portions, each having one or more dies, in accordance with certain aspects of the present disclosure. For example, the reconstituted wafer 311 may be diced into portions 402, 404, 406, 408, 410, each being used for a separate IC package. For example, each of the portions of the reconstituted wafer 311 may be hybrid bonded onto a different CMOS IC, as described herein.

Figure 5A:
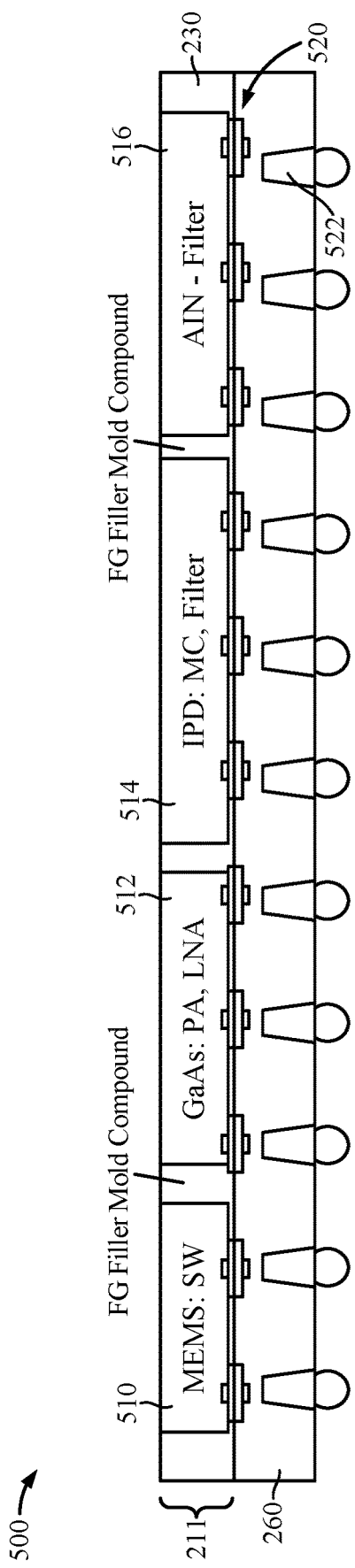
FIGS. 5A and 5B illustrate 3DICs implemented with vias through a CMOS IC, in accordance with certain aspects of the present disclosure.
Figure 5B:
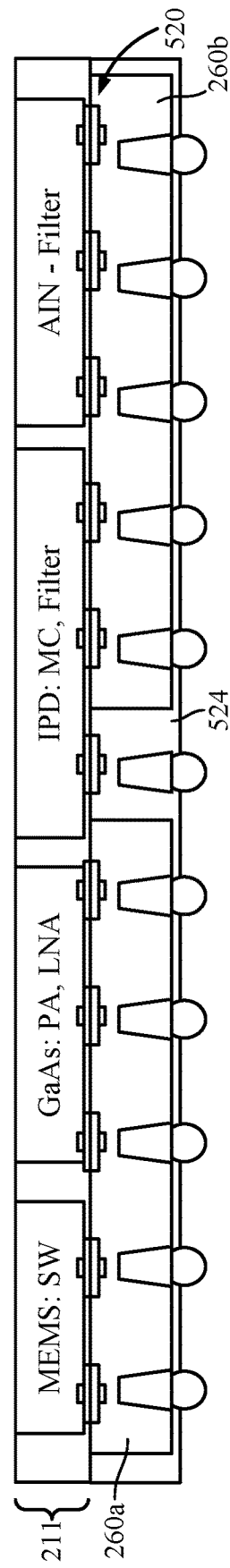

FIGS. 5A and 5B illustrate 3DICs 500, 502 implemented with vias through a CMOS IC 260, in accordance with certain aspects of the present disclosure. As illustrated in FIG. 5A, the IC package 211 may include various ICs 510, 512, 514, 516 (also referred to as dies), between which FG material 230 is deposited. The IC package 211 may include Cu pads (e.g., Cu pads 520) that are hybrid bonded, as described herein. As illustrated, through-silicon vias (e.g., via 522) may be implemented through the CMOS IC 260 for electrical connection to CMOS components of the CMOS IC. As illustrated in FIG. 5B, multiple CMOS ICs 260a, 260b may be implemented with FG material 524 in between the CMOS ICs 260a, 260b, forming a CMOS IC 260. As described herein, the FG material 230 is able to withstand the high temperatures associated with a copper damascene process used to form the Cu pads of the IC package 211.

Figure 6A:
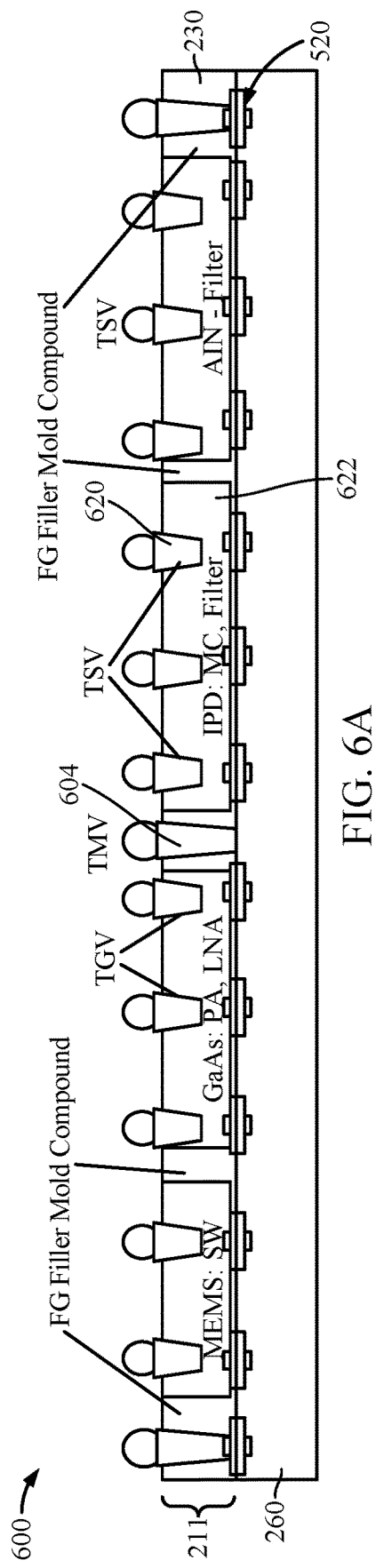
FIGS. 6A and 6B illustrate 3DICs implemented with vias through an IC package, in accordance with certain aspects of the present disclosure.
Figure 6B:
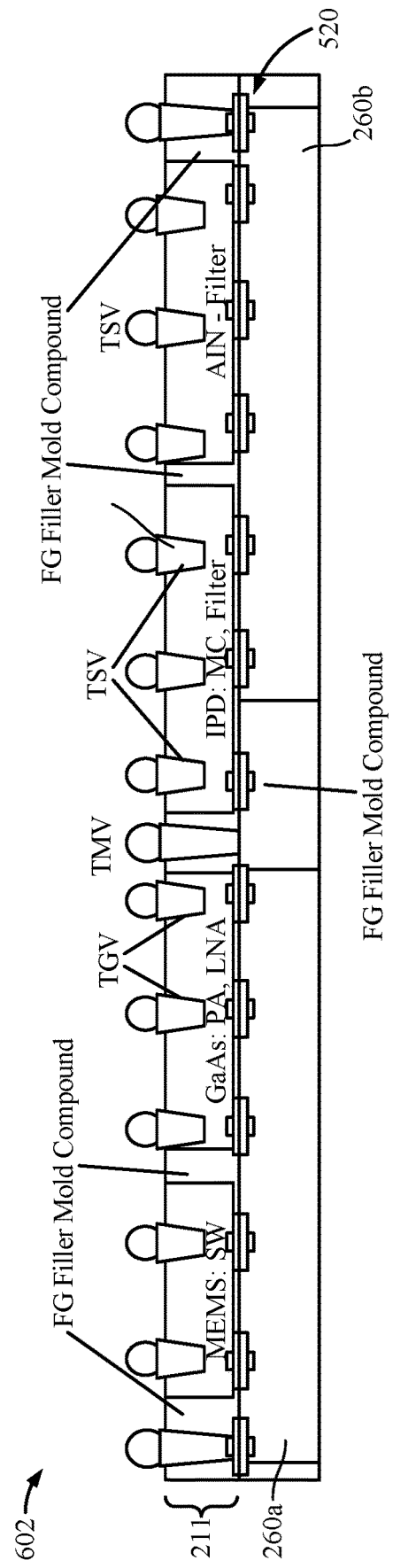

FIGS. 6A and 6B illustrate 3DICs 600, 602 implemented with vias through the IC package 211, in accordance with certain aspects of the present disclosure. As illustrated in FIG. 6A, TMVs (e.g., via 604) may be formed through the FG material 230 for electrical connectivity to the CMOS components of the CMOS IC 260. As illustrated, other vias (e.g., via 620) may be implemented for electrical connectivity to the components of dies (e.g., die 622) of the IC package 211. As illustrated in FIG. 6B, multiple CMOS ICs 260a, 260b may be implemented with FG material 524 formed in between the CMOS ICs 260a, 260b, as described herein.

The techniques described herein using a reconstituted wafer and wafer-level hybrid-bonding process allow for implementations of D2W stacking for 3DIC with high yield in a cost-effective manner by selecting known-good dies (KGDs) with high performance WBG devices (GaAs, InP, GaN HBT, HEMT, including m/pHBT and m/pHEMT) and RF-MEMS devices (e.g., switch, varactor, and resonator). Moreover, the reconstituted wafer with FG material and CMP over the hybrid bonding oxide embedded Cu allow for passivation and sealing of the die edge defects and particles that may be generated during die singulation (e.g., mechanical and laser dicing as described with respect to FIG. 4) and subsequent pick-and-place processes. The D2W hybrid bonding yield may be enhanced by the wafer-level approach described herein with the reconstituted wafer, the re-passivation, and CMP cleaning process to control the wafer surface roughness.

Figure 7:
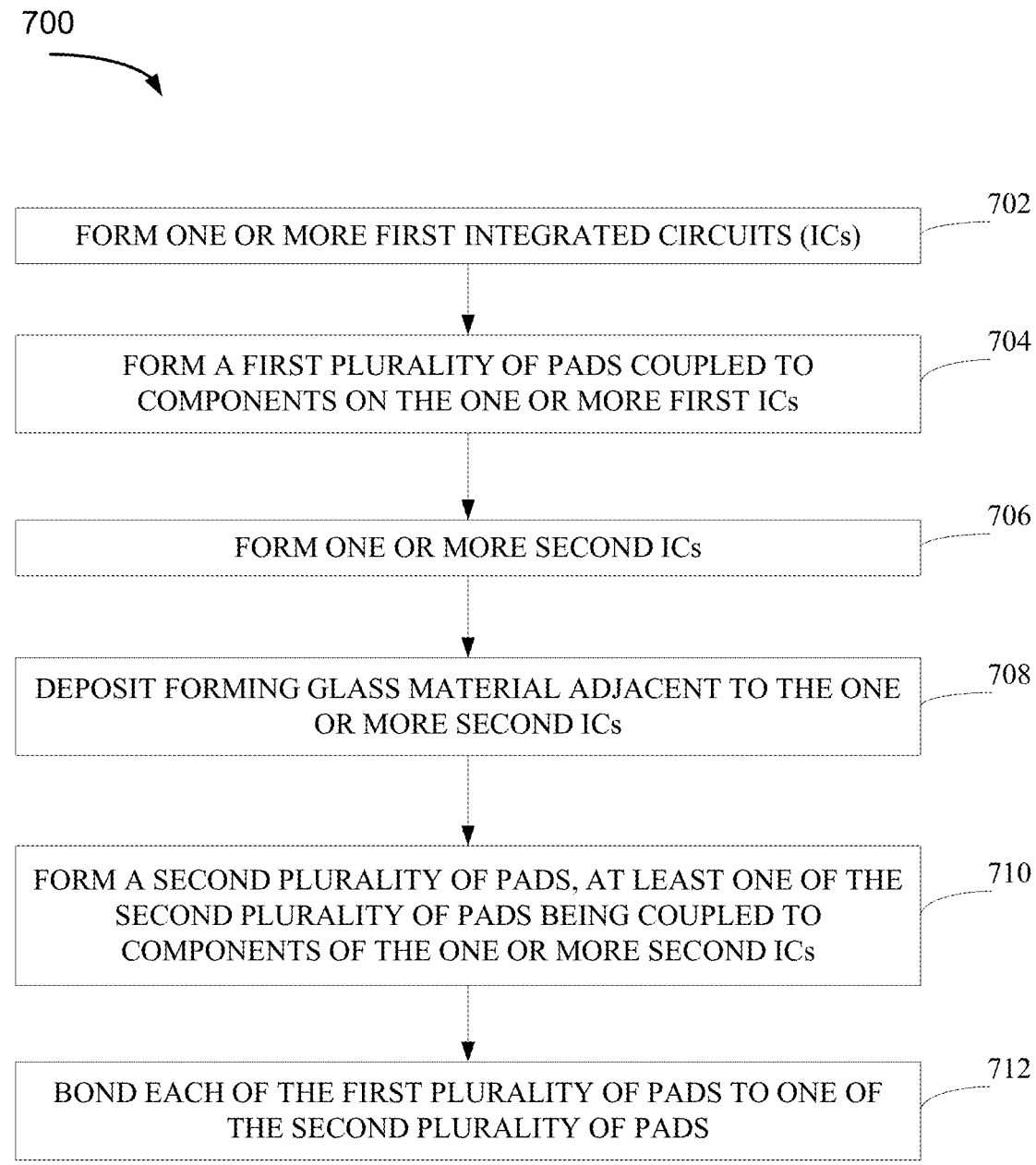
FIG. 7 is a flow diagram illustrating example operations for fabricating a semiconductor device, in accordance with certain aspects of the present disclosure.

FIG. 7 is a flow diagram illustrating example operations 700 for fabricating a semiconductor device, in accordance with certain aspects of the present disclosure. The operations 700 may be performed by a semiconductor fabrication facility.

The operations 700 begin, at block 702, with the facility forming one or more first ICs (e.g., the CMOS IC 260), and at block 704, forming a first plurality of pads (e.g., Cu pad 206a) coupled to components (e.g., CMOS transistor 204a) of the one or more first ICs. At block 706, the facility forms one or more second ICs (e.g., GaAs device die 212), and at block 708, deposits forming glass material (e.g., FG material 230) adjacent to the one or more second ICs. At block 710, the facility may form a second plurality of pads (e.g., Cu pad 207a), at least one of the second plurality of pads (e.g., Cu pad 207c) being coupled to components (e.g., HBT of the GaAs device die 212) of the one or more second ICs, and at block 712, bonding each of the first plurality of pads to one of the second plurality of pads.

In certain aspects, each of the first plurality of pads and the second plurality of pads comprises a copper pad. The copper pads may be formed using a copper damascene process.

In certain aspects, the operations 700 may also include the facility forming a first oxide material (e.g., oxide 208) between the first plurality of pads, forming a second oxide material (e.g., oxide 210) between the second plurality of pads. The operations 700 may also include the facility bonding the first oxide material to the second oxide material.

In certain aspects, the components of the first IC comprise CMOS components. In certain aspects, the operations 700 may also include forming one or more contacts (e.g., contact 290), and forming one or more vias (e.g., via 216) through the FG material between the one or more contacts and at least another one of the second plurality of pads (e.g., Cu pad 207a). In certain aspects, the at least another one of the second plurality of pads is bonded to at least one of the first plurality of pads (e.g., Cu pad 206a) coupled to the components (e.g., CMOS components) of the one or more first ICs.

In certain aspects, the one or more second ICs comprise a plurality of ICs having different component types. In certain aspects, the operations 700 may also include picking at least two of the plurality of ICs from different wafers (e.g., wafers 302, 304, 306, 308) and placing the at least two ICs on a reconstituted wafer (e.g., reconstituted wafer 311), and dicing the reconstituted wafer, the diced reconstituted wafer including the plurality of ICs. In certain aspects, the diced reconstituted wafer is removed after the bonding. In certain aspects, the plurality of ICs may include at least two of a GaAs device IC, a MEMS IC, an amplifier IC, and a SOD device IC. In certain aspects, the one or more first ICs may include a plurality of ICs, the operations 700 further including the facility depositing FG material (e.g., FG material 524) between the plurality of ICs.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A semiconductor device, comprising:
   one or more first integrated circuits (ICs);
   a first plurality of pads coupled to components of the one or more first ICs;
   one or more second ICs;
   forming glass (FG) material disposed adjacent to the one or more second ICs;
   a second plurality of pads, wherein at least one of the second plurality of pads is coupled to components of the one or more second ICs, and wherein at least a portion of the first plurality of pads is bonded to at least a portion of the second plurality of pads;
   one or more contacts; and
   one or more vias formed through the FG material between the one or more contacts and at least another one of the second plurality of pads.

2. The semiconductor device of claim 1, wherein the first plurality of pads and the second plurality of pads comprise copper pads.

3. The semiconductor device of claim 1, wherein a first oxide material is disposed between the first plurality of pads, wherein a second oxide material is disposed between the second plurality of pads, and wherein the first oxide material is bonded to the second oxide material.

4. The semiconductor device of claim 1, wherein the components of the one or more first ICs comprise complementary metal-oxide-semiconductor (CMOS) components.

5. The semiconductor device of claim 1, wherein the at least another one of the second plurality of pads is bonded to at least one of the first plurality of pads coupled to the components of the one or more first ICs.

6. The semiconductor device of claim 1, wherein the one or more second ICs comprise a plurality of ICs having different component types.

7. A semiconductor device, comprising:
   one or more first integrated circuits (ICs);
   a first plurality of pads coupled to components of the one or more first ICs;
   one or more second ICs, wherein the one or more second ICs comprise a plurality of ICs having different component types, wherein the plurality of ICs comprise at least two of:
     a gallium arsenide (GaAs) device IC;
     a micro-electro-mechanical systems (MEMS) IC;
     a silicon (Si) or GaAs amplifier IC;
     a filter device IC; and
     a silicon-on-diamond (SOD) device IC;
   forming glass (FG) material disposed adjacent to the one or more second ICs; and
   a second plurality of pads, wherein at least one of the second plurality of pads is coupled to components of the one or more second ICs, and wherein at least a portion of the first plurality of pads is bonded to at least a portion of the second plurality of pads.

8. The semiconductor device of claim 7, wherein the first plurality of pads and the second plurality of pads comprise copper pads.

9. The semiconductor device of claim 7, wherein a first oxide material is disposed between the first plurality of pads, wherein a second oxide material is disposed between the second plurality of pads, and wherein the first oxide material is bonded to the second oxide material.

10. The semiconductor device of claim 7, wherein the components of the one or more first ICs comprise complementary metal-oxide-semiconductor (CMOS) components.

11. The semiconductor device of claim 7, further comprising:
    one or more contacts; and
    one or more vias formed through the FG material between the one or more contacts and at least another one of the second plurality of pads.

12. The semiconductor device of claim 11, wherein the at least another one of the second plurality of pads is bonded to at least one of the first plurality of pads coupled to the components of the one or more first ICs.

13. The semiconductor device of claim 7, wherein the one or more first ICs comprise a plurality of ICs, the semiconductor device further comprising FG material between the plurality of ICs.

14. A semiconductor device, comprising:
    one or more first integrated circuits (ICs), wherein the one or more first ICs comprise a plurality of ICs;
    a first plurality of pads coupled to components of the one or more first ICs;
    one or more second ICs;
    forming glass (FG) material disposed adjacent to the one or more second ICs and between the plurality of ICs; and
    a second plurality of pads, wherein at least one of the second plurality of pads is coupled to components of the one or more second ICs, and wherein at least a portion of the first plurality of pads is bonded to at least a portion of the second plurality of pads.

15. The semiconductor device of claim 14, wherein the first plurality of pads and the second plurality of pads comprise copper pads.

16. The semiconductor device of claim 14, wherein a first oxide material is disposed between the first plurality of pads, wherein a second oxide material is disposed between the second plurality of pads, and wherein the first oxide material is bonded to the second oxide material.

17. The semiconductor device of claim 14, wherein the components of the one or more first ICs comprise complementary metal-oxide-semiconductor (CMOS) components.

18. The semiconductor device of claim 14, further comprising:
    one or more contacts; and
    one or more vias formed through the FG material between the one or more contacts and at least another one of the second plurality of pads.

19. The semiconductor device of claim 18, wherein the at least another one of the second plurality of pads is bonded to at least one of the first plurality of pads coupled to the components of the one or more first ICs.

20. The semiconductor device of claim 14, wherein the one or more second ICs comprise a plurality of ICs having different component types.

* * * * *